United States Patent
Keller et al.

(10) Patent No.: US 9,672,008 B2
(45) Date of Patent: Jun. 6, 2017

(54) PAUSIBLE BISYNCHRONOUS FIFO

(71) Applicant: NVIDIA Corporation, Santa Clara, CA (US)

(72) Inventors: Benjamin Andrew Keller, Oakland, CA (US); Matthew Rudolph Fojtik, Raleigh, NC (US); Brucek Kurdo Khailany, Austin, TX (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 14/948,175

(22) Filed: Nov. 20, 2015

(65) Prior Publication Data
US 2016/0148661 A1   May 26, 2016

Related U.S. Application Data

(60) Provisional application No. 62/083,845, filed on Nov. 24, 2014.

(51) Int. Cl.
*G11C 7/00* (2006.01)
*G06F 5/06* (2006.01)
(Continued)

(52) U.S. Cl.
CPC .............. *G06F 5/06* (2013.01); *G11C 7/222* (2013.01); *G11C 8/16* (2013.01);
(Continued)

(58) Field of Classification Search
CPC .......... G06F 1/12; G06F 5/10; G06F 13/1694; G06F 13/4243; G06F 13/4291;
(Continued)

(56) References Cited

U.S. PATENT DOCUMENTS 5,621,774 A * 4/1997 Ishibashi .................. G06F 1/10
                                                          327/152
6,055,285 A * 4/2000 Alston ..................... H04J 3/062
                                                          375/356
(Continued)

FOREIGN PATENT DOCUMENTS

TW      200634481       10/2006
TW      I348088 B        9/2011
(Continued)

OTHER PUBLICATIONS

Lim, Willie; Cox, Jerome. Clocks and the performance of synchronisers, Nov. 11, 2008, IEEE Proceedings E, vol. 130 Issue 2, pp. 57-64.*

(Continued)

*Primary Examiner* — Son Dinh
*Assistant Examiner* — Uyen B Tran
(74) *Attorney, Agent, or Firm* — Zilka-Kotab, PC

(57) ABSTRACT

A system, method, and computer program product are provided for a pausible bisynchronous FIFO. Data is written synchronously with a first clock signal of a first clock domain to an entry of a dual-port memory array and an increment signal is generated in the first clock domain. The increment signal is determined to transition near an edge of a second dock signal, where the second clock signal is a pausible clock signal. A next edge of the second clock signal of the second clock domain is delayed and the increment signal to the second clock domain and is transmitted.

19 Claims, 15 Drawing Sheets

(51) Int. Cl.
*G11C 7/22* (2006.01)
*G11C 8/16* (2006.01)

(52) U.S. Cl.
CPC ................. *G06F 2205/061* (2013.01); *G11C 2207/2254* (2013.01); *G11C 2207/2272* (2013.01)

(58) Field of Classification Search
CPC . G06F 2205/061; G06F 9/544; G11C 7/1075; G11C 7/222; G11C 7/1039; G11C 8/16
See application file for complete search history.

(56) References Cited

U.S. PATENT DOCUMENTS

| | | | | |
|---|---|---|---|---|
| 6,850,092 B2* | 2/2005 | Chelcea | ................... | G06F 5/14 326/93 |
| 8,428,207 B1* | 4/2013 | Dally | ................... | H04L 7/0012 375/354 |
| 2006/0161797 A1* | 7/2006 | Grass | ................... | G06F 1/08 713/400 |
| 2010/0306426 A1* | 12/2010 | Boonstra | ................... | G06F 5/12 710/57 |
| 2011/0204932 A1* | 8/2011 | Cortadella | ................ | G06F 7/00 327/145 |

FOREIGN PATENT DOCUMENTS

| | | |
|---|---|---|
| WO | 2004/084070 A1 | 9/2004 |
| WO | 2012/164541 A1 | 12/2012 |

OTHER PUBLICATIONS

Moore, S. et al., "Point to Point GALS Interconnect," Proc. IEEE Symposium on Asynchronous Circuits and Systems, 2002, pp. 69-75.

Mullins, R. et al., "Demystifying Data-Driven and Pausible Clocking Schemes," 13th IEEE International Symposium on Asynchronous Circuits and Systems, 2007, pp. 1-11.

Fan, X. et al., "Analysis and Optimization of Pausible Clocking based GALS Design," IEEE, 2009, pp. 358-365.

Office Action from Tawainese Application No. 104138930, dated Aug. 22, 2016.

* cited by examiner

Adaptive Clock Generator
200

Pausible Clock Synchronizer
210

PAUSIBLE BISYNCHRONOUS FIFO

CLAIM OF PRIORITY

This application claims the benefit of U.S. Provisional Application No. 62/083,845 titled "Pausible Bisynchronous FIFO," filed Nov. 24, 2014, the entire contents of which are incorporated herein by reference.

This invention was made with Government support under Agreement No. HR0011-13-3-0001 awarded by DARPA, and under LLNS subcontract B599861 awarded by DOE. The Government has certain rights in this invention.

FIELD OF THE INVENTION

The present invention relates to synchronization, and more specifically synchronization using a pausible clock.

BACKGROUND

Modern system on a chip (SoC) designs built in deeply scaled process nodes present extraordinary design challenges. Slow wires and process, voltage, and temperature (PVT) variation make the synchronous abstraction increasingly untenable over large chip areas, requiring immense effort to achieve timing closure. The globally asynchronous, locally synchronous (GALS) design methodology is one means of mitigating the difficulty of global timing closure. GALS design flows delimit "synchronous islands" of logic that operate on local clocks and communicate with each other asynchronously.

Individual clock domains in large commercial designs still span many square millimeters, and so many of the design challenges posed by a fully synchronous design persist in GALS systems. The full advantages of GALS design can only be realized if large SoCs are partitioned into myriad small synchronous blocks, not a handful of large areas, an approach referred to as fine-grained GALS. Industry has been reluctant to adopt the fine-grained GALS approach due to three main issues: the difficulty of generating many local clocks, the latency incurred by asynchronous boundary crossings, and the challenge of integrating GALS methodology into standard application specific integrated circuit (ASIC) design tool flows. There is thus a need for addressing these and/or other issues associated with the prior art.

SUMMARY

A system, method, and computer program product are provided for a pausible bisynchronous first-in first-out (FIFO) buffer. Data is written synchronously with a clock signal of a first clock domain to an entry of a dual-port memory array and an increment signal is generated in the first clock domain. The increment signal transitions near an edge of a second clock signal. A next edge of the second clock signal of the second clock domain is delayed and the increment signal is transmitted to the second clock domain. When the increment signal does not transition near an edge of the second clock signal, the increment signal is transmitted to the second clock domain without delaying the next edge of the second clock signal.

DETAILED DESCRIPTION

Many of the challenges of modern system on a chip (SoC) design can be mitigated or eliminated with globally asynchronous, locally synchronous (GALS) design techniques. Partitioning a design into many synchronous islands introduces myriad asynchronous boundary crossings that typically incur high latency. A pausible bisynchronous first-in first-out (FIFO) buffer may achieve a low interface latency when a pausible clocking scheme is used. While traditional synchronizers have a non-zero probability of metastability and error, pausible clocking enables error-free operation by permitting infrequent slowdowns in the clock rate.

Low-latency asynchronous boundary crossings may be achieved using pausible clocks. In one embodiment, an interface uses a dual-port memory array to store data and synchronizes read and write pointer updates using two-phase signals that allow data written to and read from a dual-port memory array to traverse the interface with very low latency.

The dual-port memory array is configured as a two-ported bisynchronous FIFO, a circuit element that integrates well with standard computer aided design (CAD) toolflows. In one embodiment, the pausible bisynchronous FIFO may achieve an average latency of 1.34 cycles across an asynchronous interface while using less energy and area than traditional synchronizers. In other embodiments, the pausible bisynchronous FIFO achieves different average latencies when the asynchronous interface is crossed. In general, the average latency may vary for different process technologies, clock speeds, circuit topologies, and the like.

Figure 1:
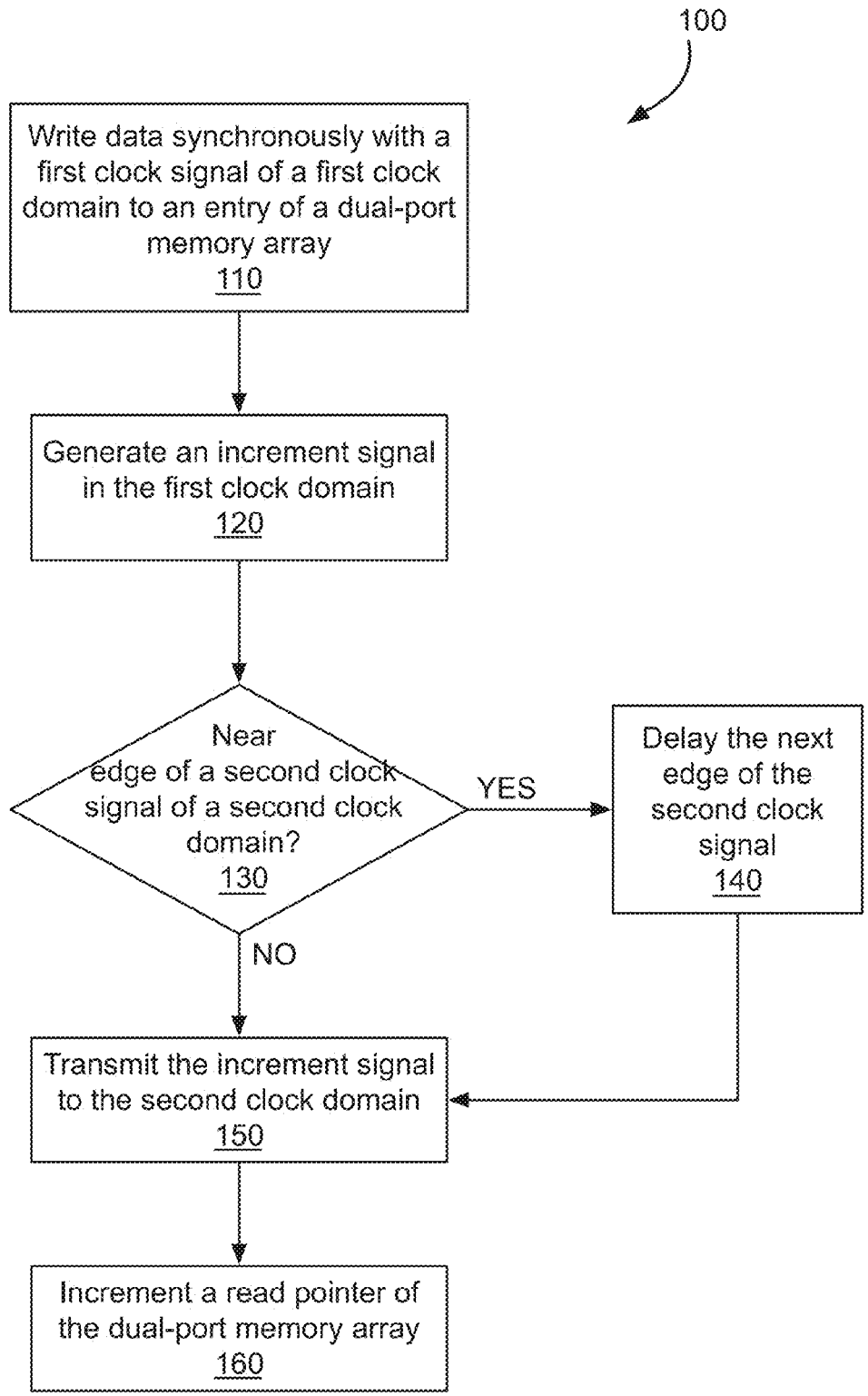
FIG. 1 illustrates a method for updating a read pointer of a pausible bisynchronous FIFO, in accordance with one embodiment.

FIG. 1 illustrates a method 100 for updating a read pointer of a pausible bisynchronous FIFO, in accordance with one embodiment. At step 110, data is written synchronously with a first clock signal of a first clock domain to an entry of a dual-port memory. In the context of the present description, a dual-port memory array includes one write port and one read port that may be accessed simultaneously. A write pointer indicates the next entry to be written and a read pointer indicates a next entry to be read. When the dual-port memory array is configured as a first-in first-out buffer, the write pointer indicates the next entry to which data is "pushed" and the read pointer indicates the next entry to which data is "popped." Data is read from the dual-port memory synchronously with a second clock signal of a second clock domain. In one embodiment, both the first and second clock signals are pausible clock signals. In another embodiment, either the first clock signal or the second clock signals is pausible and the other clock signal is not pausible. The first clock signal and the second clock signal may operate at the same frequency or at different frequencies. In contrast with a clock signal having a fixed frequency (and a fixed period), a pausible clock signal does not have a fixed frequency because one or more edges of the pausible clock signal may be delayed.

At step 120, an increment signal is generated in the first clock domain. The increment signal is generated in response to writing data to the entry. In one embodiment, the increment signal is configured to increment the read pointer that is in the second clock domain. In the context of the following description, the increment signal is a pulse that is asserted until confirmation that the increment signal was received in the second clock domain is received.

At step 130, if the increment signal transitions near an edge of the second clock signal, then at step 140, the second clock signal is paused to delay the next edge of the second clock signal. Otherwise, at step 150, the increment signal is transmitted from the first clock domain to the second clock domain. In one embodiment, the increment signal is determined to transition near the edge of the second clock signal if the increment signal transitions while the second clock signal is in a low phase (e.g., the second clock signal is FALSE). In another embodiment, the increment signal is determined to transition near the edge of the second clock signal if the increment signal transitions while the second clock signal is in a high phase (e.g., the second clock signal is TRUE). At step 160, a read pointer of the dual-port memory array is incremented in response to receiving the increment signal. In one embodiment, an acknowledge signal is transmitted from the second clock domain to the first clock domain to confirm that the increment signal was received.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Historically, on-chip clock signals have been generated by phase-locked loop (PLL) circuits. The PLL circuits can reliably generate a fixed target frequency, but are large, power-hungry, and difficult to design, making them poor candidates fir inclusion in each synchronous island of a GALS system. In contrast, an adaptive clocking scheme does not operate at a particular frequency, and instead uses replica critical path circuits to continuously adjust the generated clock signal. The clock period of an adaptive clock signal can temporarily vary and adaptive clock generators do not entail the complexity of clocking schemes implemented using PLL circuits.

Figure 2A:
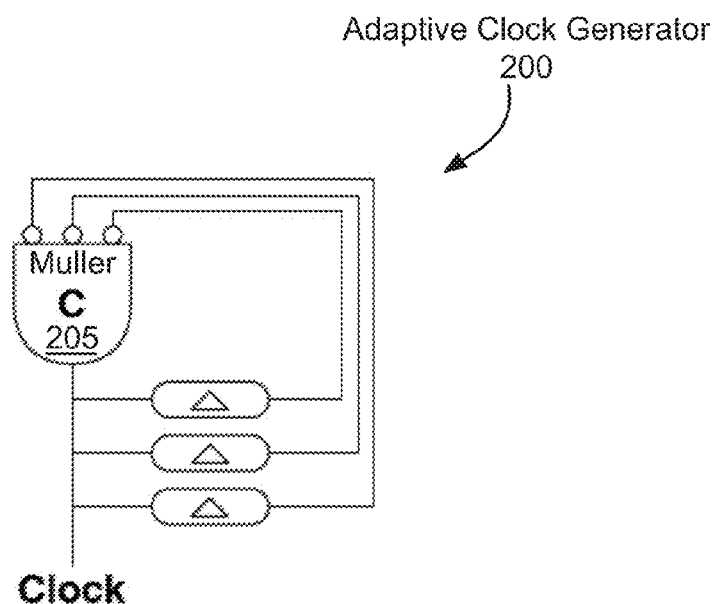
FIG. 2A illustrates an adaptive clock generator, in accordance with one embodiment.

FIG. 2A illustrates an adaptive clock generator 200, in accordance with one embodiment. A simple adaptive clock circuit, such as the adaptive dock generator 200 includes one or more inverting delay lines fed into the input of a Muller C-element 205. The delay lines replicate the various critical paths found in the synchronous logic island; the Muller C-element 205 ensures that the next clock edge will not be generated until the slowest replicated critical path resolves. Adaptive clock circuits may already be present in many GALS implementations and a pausible clock circuit may be combined with the adaptive clock generator 200 to reduce synchronization latency.

Signals crossing the boundary between fully asynchronous clock domains, such as signals crossing between synchronous islands in a GALS design, must be synchronized to minimize the risk of metastability and operational failure. This synchronization is typically achieved by sending such signals through several flip-flops in series in the receiver clock domain. The flip-flops delay the signal for one or more cycles, providing extra time for any metastability to resolve. While these brute force (BF) synchronizers do not eliminate the possibility of metastability, they can reduce the probability until it is negligible. Brute force synchronizers can be used with a FIFO memory to construct a brute force bisynchronous FIFO. A brute force bisynchronous FIFO safely transmits data between two clock domains, synchronizing the read and write pointers with BF synchronizers. The read and write pointers must be gray coded so that any synchronization error does not disrupt the pointer location by more than one increment; the logic to encode and decode the read and write pointers is a circuitry overhead cost of a brute force bisynchronous FIFO implementation.

Brute force synchronizers deliberately add latency to the domain-crossing path to allow any metastability condition time to resolve. However, the added latency slows communication between clock domains, creating a severe barrier to adoption of a chip with many different clock domains. Additionally, it is impossible to completely remove the potential for a metastable condition to propagate, giving these circuits a "mean time to failure" which must be carefully considered.

Conventional approaches reduce the latency of clock domain crossing by making assumptions about the relative frequency or phase of the two clocks. The conventional approaches cannot be relied on because the assumptions are not valid for a fully asynchronous interface. Other approaches use fully asynchronous logic that does not depend on clocks at all. However, asynchronous logic often consumes more power than its synchronous equivalent, and it can be difficult to incorporate into standard CAD flows for synthesis and verification.

Figure 2B:
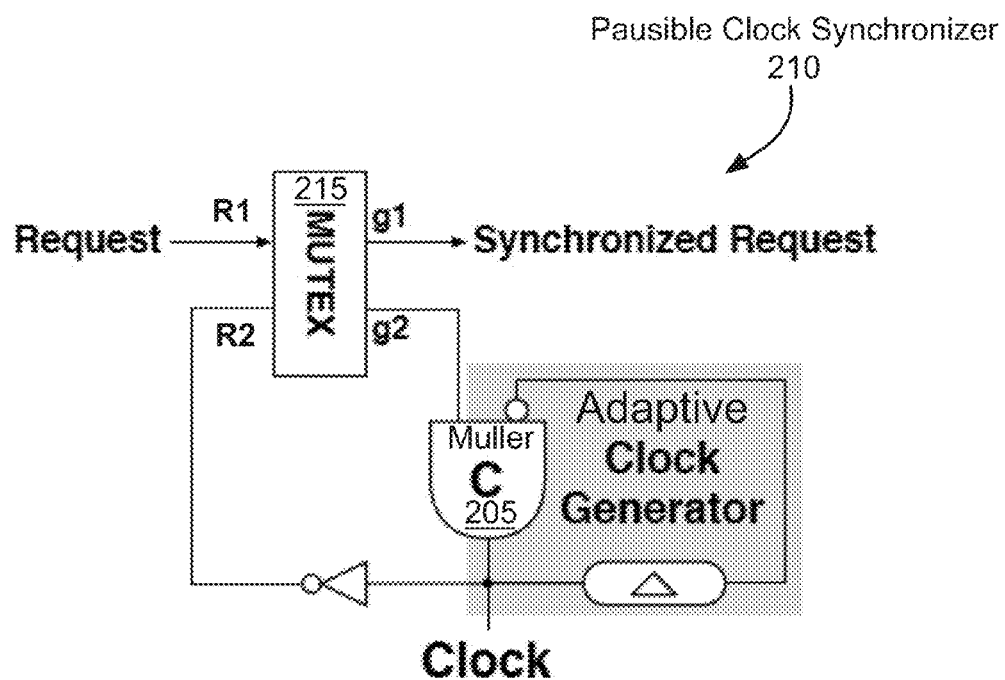
FIG. 2B illustrates a pausible clock synchronizer, in accordance with one embodiment.

In one embodiment, a synchronizing FIFO takes advantage of an asynchronous technique that relies on pausible clocks. The technique delays data signals that arrive in an unsafe window of the receive clock such that the data signals are not sampled at a problematic time. FIG. 2B illustrates a pausible clock synchronizer 210, in accordance with one embodiment. A mutual exclusion element (mutex) 215 is a circuit that grants priority either to an incoming (un-synchronized) request signal (input R1) or to the upcoming clock edge (input R2). The mutex 215 ensures that the asynchronous request signal received at input R1 cannot toggle simultaneously with the rising clock edge. More specifically, the mutex 215 ensures that the g1 output does not toggle while the R2 input is in a high phase, which, in turn, ensures that the g1 output does not toggle simultaneously with the rising clock edge. In another embodiment, a mutex circuit is configured to ensure that the g1 output does not toggle while the R2 input is in a low phase, which, in turn, ensures that the g1 output does not toggle simultaneously with the falling clock edge.

The mutex 215 is added to a ring oscillator clock circuit that may be implemented as an adaptive clock generator. The clock input to the mutex should have priority for the next clock edge to fire, and the priority is enforced by the mutex 215. A Muller C-element 205 ensures that the next edge of the clock waits until the clock input to the mutex 215 (e.g., R2) gets priority. The clock input is the receiving clock with which the request signal will be synchronized. If a request signal (e.g. rising edge of a pulse) arrives during a low phase of the clock (prior to when a transition of the request signal could cause metastability), the request signal cannot gain priority and is delayed one clock cycle. The delayed request signal is output by the mutex 215 as a synchronized request to a receiving block. The signal received at the R2 input to the mutex 215 (i.e., inverted clock) is output as g2.

Figure 2C:
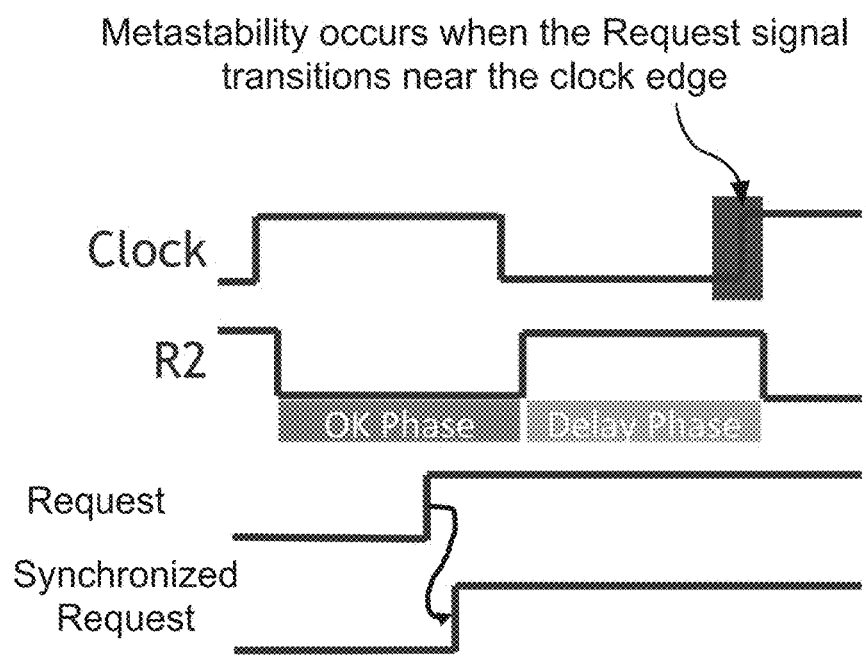
FIG. 2C illustrates a timing diagram showing transmission of a signal between two clock domains, in accordance with one embodiment.

FIG. 2C illustrates a timing diagram 220 showing transmission of a signal between two clock domains, in accordance with one embodiment. The clock waveform is a receiving clock and the pausible clock synchronizer 210 synchronizes the request signal with the receiving clock to generate the synchronized request signal. When the R2 input is low, the mutex 215 is transparent and the request signal at R1 is passed through to generate the synchronized request signal.

Figure 2D:
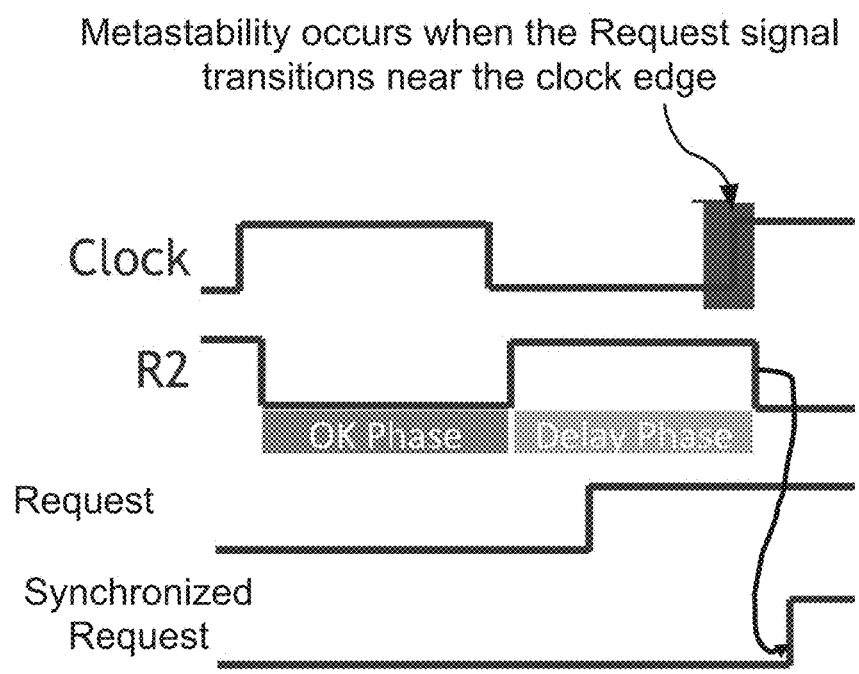
FIG. 2D illustrates a timing diagram showing delayed transmission of a signal between two clock domains, in accordance with one embodiment.

If a request signal arrives during a high phase of the clock, the request signal is safe from metastability and is immediately output by the pausible clock synchronizer 210 as the synchronized request to the receiving block. FIG. 2D illustrates a timing diagram 220 showing delayed transmission of the request signal between two clock domains, in accordance with one embodiment. When the mutex 215 R2 input is high, the mutex 215 is opaque and the request signal at the R1 input is delayed until the clock edge has passed. The signal received at the R2 input to the mutex 215 (i.e., inverted clock) is output as g2. In the event the mutex 215 goes metastable, the next edge of the clock is simply delayed, so the pausible clock synchronizer 210 is immune to metastability-related failure.

Figure 2E:
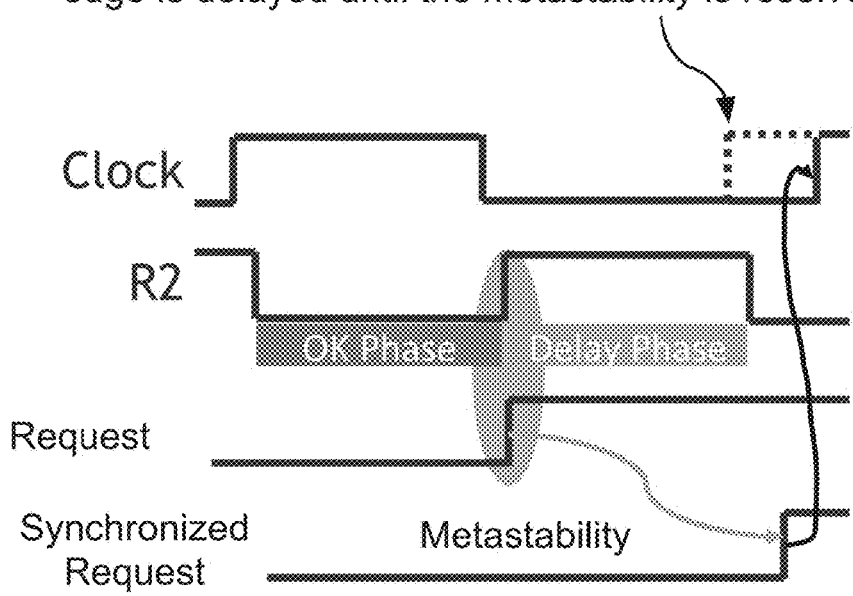
FIG. 2E illustrates a timing diagram showing transmission of a signal between two clock domains when a clock signal is paused, in accordance with one embodiment.

FIG. 2E illustrates a timing diagram 230 showing transmission of a signal between two clock domains when a clock signal is paused, in accordance with one embodiment. Because the mutex 215 can become metastable if the R1 and R2 inputs toggle simultaneously, the clock can pause for an arbitrarily long duration (with vanishingly small probability) if R1 and R2 transition high at the same time. However, there is no longer any danger of metastability at the asynchronous input, and typical circuit operation synchronizes input signals with roughly one cycle of latency. As shown in FIG. 2E, the signal received at the R2 input to the mutex 215 (i.e., inverted clock) is delayed and output as g2.

As previously explained, pausible clocking enables low-latency synchronization of signals with arbitrary relative phase, and as such represents an attractive option for boundary crossings in GALS design. In one embodiment, pausible clocking is used perform flow control of a two-ported synchronous memory array to implement a bisynchronous FIFO. A "synchronous" FIFO/memory is one where the reads and writes are timed by the same clock. A "bisynchronous" FIFO/memory is one where the reads are synchronous to one clock and writes are synchronous to a second clock. An "asynchronous" FIFO is not clocked, but instead is read and written according to arbitrarily timed signals (such as request and acknowledge signals). A simple "asynchronous" FIFO operates as a shift register, where written data moves forward towards the tail of the FIFO whenever the register ahead of the written data is empty, without needing to wait for the next clock cycle. Asynchronous FIFOs are usually power-hungry because the data moves through every entry in the FIFO rather than remaining in place (i.e., in the entry that was written) and moving the read and write pointers.

Conventional asynchronous FIFOs have several disadvantages compared with synchronous FIFOs. Rather than keeping data stored in an entry in place and updating read and write pointers as data is read and written, conventional asynchronous FIFOs propagate data through different entries from the back to the front of a queue. The data movement through the different entries incurs a penalty in both energy and latency, a penalty that increases with the queue depth. Furthermore, many conventional asynchronous FIFOs require careful delay matching to satisfy two-sided timing constraints. Conventional asynchronous FIFOs necessarily require careful asynchronous circuit design and verification of asynchronous FIFOs is poorly supported by standard very large scale integration (VLSI) toolflows.

A pausible clocking technique may be used with a two-ported synchronous memory array to implement a pausible bisynchronous FIFO that may be synchronously written in one clock domain and synchronously read in another clock domain. Data is stored in the two-ported synchronous memory array while the read and write pointers are synchronized between clock domains. In contrast with a conventional bisynchronous FIFO, synchronization of the read and write pointers is completed with a pausible clock network in the pausible bisynchronous FIFO, not with slow (i.e., high latency) brute force synchronizers. The pausible bisynchronous FIFO design has an advantage of low-latency synchronization resulting from pausible clocking and maintains the favorable characteristics of standard two-ported FIFOs.

Figure 3A:
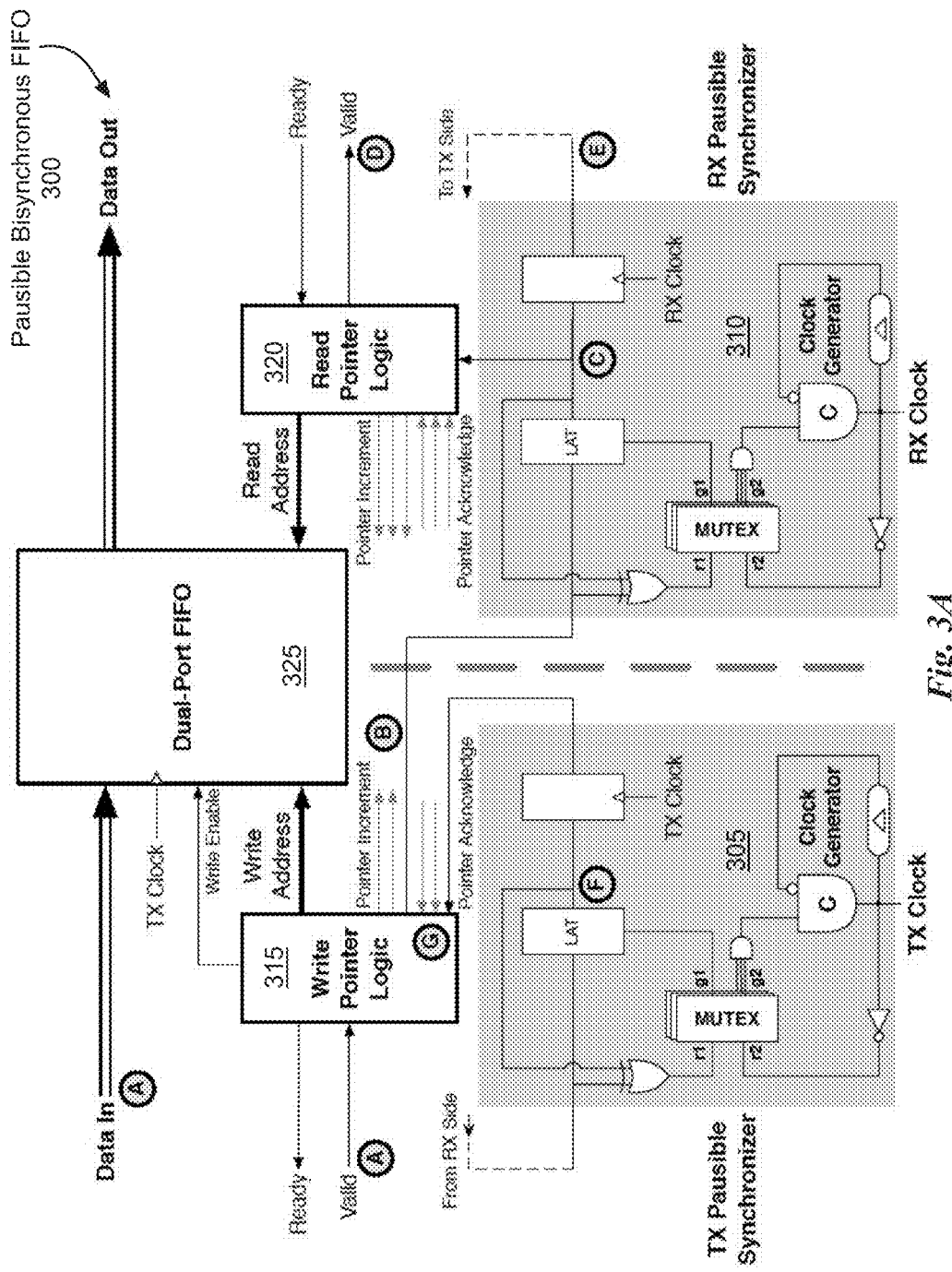
FIG. 3A illustrates a pausible bisynchronous FIFO, in accordance with one embodiment.
Figure 3B:
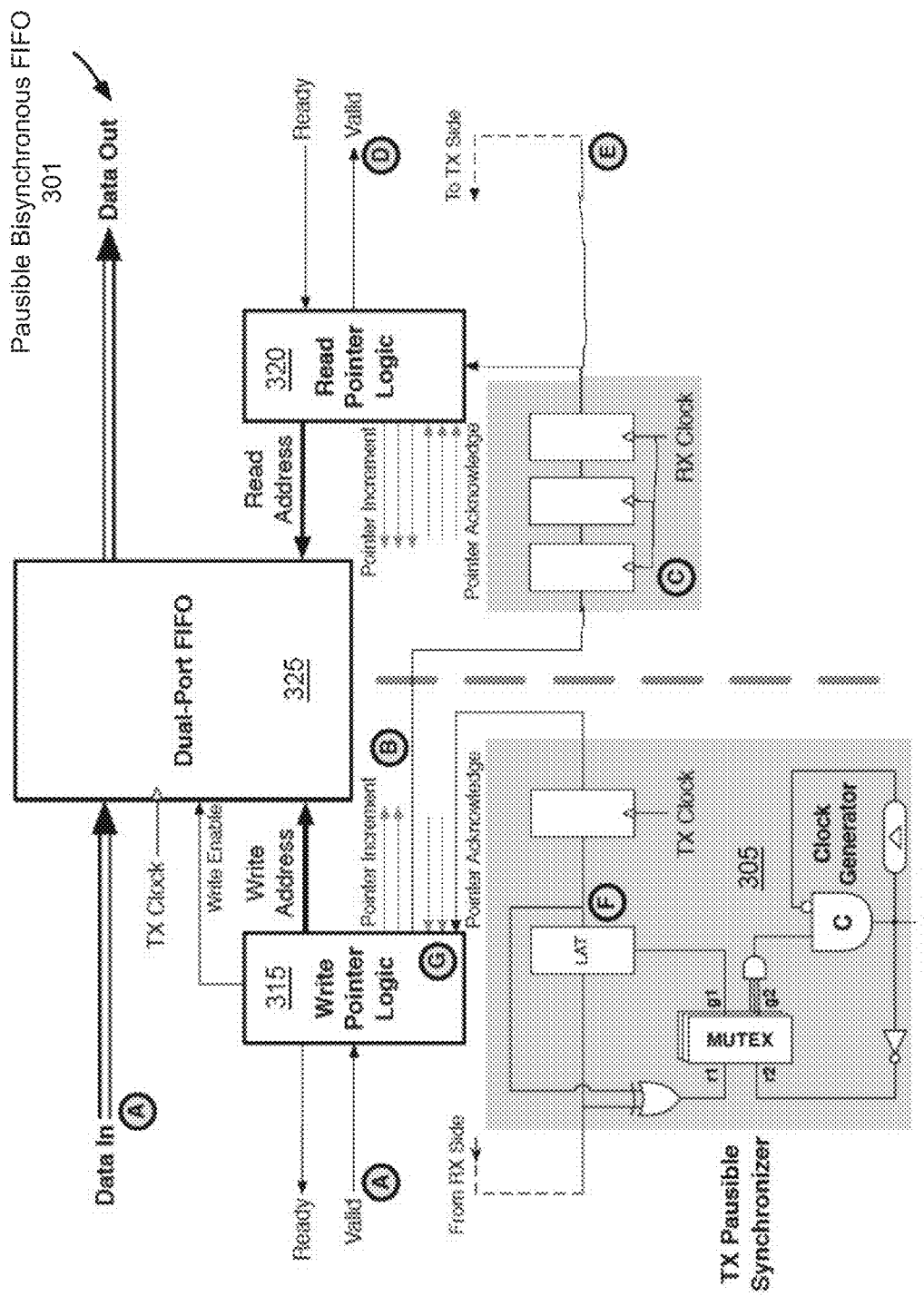
FIG. 3B illustrates another pausible bisynchronous FIFO in accordance with one embodiment.

FIG. 3A illustrates a pausible bisynchronous FIFO 300, in accordance with one embodiment. Only one of the increment-acknowledge paths is shown for clarity; in the complete system, each increment and acknowledge line may be implemented using a dedicated mutex 215 and synchronization circuitry. The labeled letters (e.g., A, B, C, D, E, F, and G) show the sequence necessary to synchronize data through the pausible bisynchronous FIFO 300, and are described further herein. Pausible clock synchronizers 305 and 310 provide synchronization in both the transmit (TX) and receive (RX) clock domains. The circuits used to implement the pausible clock synchronizers 305 and 310 are similar to the pausible clock synchronizers 210 with the inclusion of a feedback latch and exclusive-OR (XOR) gate.

A latch is used instead of a flip-flop to reduce overhead. The XOR gate ends a request pulse after a request is synchronized with the receive clock. As shown in FIG. 3A, the request (e.g., pointer increment signal or pointer acknowledge signal) is transmitted to the second clock domain through the feedback latch coupled to a flip-flop. The feedback latch may be directly coupled to the flip-flop or may be indirectly coupled to the flip-flop through one or more buffers or other circuits.

Note that, in one embodiment, pausible clock synchronizers 305 and 310 each rely on an input pointer increment or acknowledge signal to implement a two-phase request-acknowledge protocol. The two-phase request-acknowledge protocol ensures that the unsynchronized request signal can only be asserted once, and then an acknowledgement should be received before the request signal is asserted again. The two-phase request-acknowledge protocol prevents additional switching of the request signal during an unsafe clock phase. By design, the two-phase request-acknowledge protocol prevents multiple assertions within a single clock period; however, limiting the frequency of the requests is problematic for the synchronization of pointer updates, because it implies that each pointer can only be updated once per cycle, restricting throughput to the slower of the two clock periods.

Accordingly, the pausible bisynchronous FIFO 300 does not synchronize the multi-bit pointers directly. Instead, several single-bit, two-phase pointer increment lines signal an update to the read or write pointers, and corresponding pointer acknowledge signals are returned once the respective increments are synchronized. Multiple pointer increments may occur in succession within a single clock period, and full throughput is allowed even at mismatched clock periods. In one embodiment, three increment-acknowledge pairs in either direction are implemented. Additional increment and acknowledge lines may be added to ensure full throughput in the case of extreme mismatches between TX and RX clock periods.

Each of the increment and acknowledge signals is synchronized through a dedicated mutex 215 in a respective pausible clock synchronizer (e.g., TX pausible synchronizer 305 and RX pausible synchronizer 310) comprising a corresponding pausible clock network. The g2 outputs of all mutexes 215 within each of pausible clock synchronizer 305 and 310 are ANDed together, and the result is used as the synchronizing input to the Muller C-element 205, ensuring that the clock edge is not generated until every mutex 215 guarantees a safe phase. Additional interfaces (e.g., to multiple different synchronous islands) can also be accommodated in the same manner: the g2 outputs from every interface can be ANDed together to ensure that all interfaces synchronize correctly. Synchronizing multiple interfaces does have the side effect that a clock pause from any one interface will stall the entire synchronous domain.

In the TX domain, write pointer logic 315 stores the value of the write pointer, as well as an approximated read pointer (possibly delayed from the actual read pointer position as updates are synchronized from the RX domain). Write pointer logic 315 uses the write pointer and approximated read pointer values to calculate whether the dual-port FIFO 325 is full, and to signal backpressure accordingly. The write pointer logic 315 also transmits write pointer increment signals to the receive clock domain (RX clock) by toggling one of the two-phase write pointer increment lines in the event of a write to an entry of the dual-port FIFO 325. A state machine within the write pointer logic 315 tracks which write pointer increment signals are inflight and which have been acknowledged and can be used again.

In the RX domain, read pointer logic 320 stores the value of the read pointer, as well as an approximated write pointer (possibly delayed from the actual write pointer position as updates are synchronized from the TX domain). When multiple write pointer increment signals are received in the same clock cycle, the read pointer logic 320 combines the separate write pointer increment signals so that the approximated write pointer value is incremented by one, two, three, or more in a single clock cycle. Read pointer logic 320 uses the read pointer and approximated write pointer values to calculate whether the dual-port FIFO 325 is empty. Time read pointer logic 320 also transmits read pointer increment signals to the transmit clock domain (TX clock) by toggling one of the two-phase read pointer increment lines in the event of a read from an entry of the dual-port FIFO 325. In one embodiment, when multiple read pointer increment signals are received by the write pointer logic 315 in the same clock cycle, the write pointer logic 315 combines the separate write pointer increment signals so that the approximated read pointer value is incremented by one, two, three, or more in a single clock cycle.

A state machine within the read pointer logic 320 tracks which read pointer increment signals are inflight and which have been acknowledged and can be used again. In one embodiment, when multiple acknowledge signals are received in the same clock cycle, the read pointer logic 320 combines the separate acknowledge signals so that the number of inflight read pointer increment signals may be updated by one, two, three, or more in a single clock cycle. With the combination of the write pointer logic 315, read pointer logic 320, and the pausible clock synchronizers 305 and 310, the pausible bisynchronous FIFO 300 can synchronize new input data in roughly one cycle on average.

The dual-port FIFO 325 is clocked by the TX clock, and includes a memory array that can be implemented as flip-flops, a latch array, or a static random access memory (SRAM). Such FIFOs are standard circuit elements in modern designs, and the numerous area and energy optimizations developed for FIFOs can be leveraged with no additional design effort. In one embodiment, no custom design is needed to implement the dual-port FIFO 325, and standard scan and test structures can be easily implemented.

FIG. 3A illustrates another pausible bisynchronous FIFO 301, in accordance with one embodiment. In this embodiment, the pausible bisynchronous FIFO 301 is modified to interface between a clock domain with pausible clocking and one with a traditional fixed reference, such as a PLL. By replacing the pausible synchronizer on the fixed-reference side of the interface with brute-force synchronizing flip-flops to synchronize the increment and acknowledge pointers, low latency can be maintained in one direction. Consequently, a system can be partially converted to a GALS design while maintaining legacy logic with traditional clocking where necessary. These advantages make the pausible bisynchronous FIFO 300 and 301 a good candidate to overcome the barriers to widespread GALS adoption.

The labeled sequence in FIG. 3A shows the series of steps involved in writing a data word to the pausible bisynchronous FIFO 300. In one example, the pausible bisynchronous FIFO 300 is initially empty, and all two-phase increment and acknowledge lines are available for use. On the rising edge of the TX clock, data is written to the entry specified by the write address (i.e., corresponding to the write pointer) and the input valid signal is asserted (label A). Once the data is written into the entry, data is available to be read out of the pausible bisynchronous FIFO 300. The write pointer logic 315 increments the write pointer for the TX domain, and toggles one of the two-phase write pointer increment lines B).

The write pointer increment line is toggled in the TX domain. Therefore the write pointer increment line is asynchronous to the RX domain and should be synchronized through the RX pausible synchronizer 310. Depending upon the phase at which the write pointer increment toggle arrives at the RX domain, the write pointer increment may pass through the mutex 215 immediately, be delayed until after the next RX clock edge, or (in rare cases) cause metastability in the mutex 215 and be delayed for a longer time. However, the write pointer increment will eventually be synchronized into the RX domain (label C), at after which the read pointer logic 320 can increment the approximation of the internal write pointer and assert a valid signal at the output of the pausible bisynchronous FIFO 300 (label D).

When the valid signal is asserted, the data can be synchronously read from the dual-port FIFO 325 in the RX domain. Once a read occurs, the RX pointer logic 320 toggles one of the read pointer increment signals to inform the TX domain that a read has occurred and the read pointer has been updated (this series of toggles is not labeled in FIG. 3A). However, from the perspective of the TX domain, when the valid signal is asserted by the read pointer logic 320, the write pointer increment is still inflight, as a corresponding acknowledge signal has not yet been received from the RX domain by the write pointer logic 315. Accordingly, after the synchronization of the write pointer update, the RX clock edge toggles the corresponding acknowledge line (label E). As the toggling of the corresponding acknowledge line occurs in the RX clock domain, the pointer acknowledge signal must be synchronized through the TX pausible synchronizer 305 (label F). The synchronized pointer acknowledge signal then updates the TX logic state machine in the write pointer logic 315, freeing the write pointer increment line for future use (label G).

As previously explained, in one embodiment, the pausible bisynchronous FIFO 300 is modified to interface between a clock domain with pausible clocking and one with a traditional fixed reference, such as a PLL. Specifically, in one embodiment, the pointer increment signals generated by the read pointer logic 320 may be brute-force synchronized using multiple flip-flops clocked using the first clock signal instead synchronizing the (read) pointer increment signals using a second RX pausible synchronizer 310 (not shown). Similarly, the corresponding (read) pointer acknowledge signal may be brute-force synchronized using multiple flip-flops clocked using the second clock signal instead of synchronizing the (read) pointer acknowledge signal using a second TX pausible synchronizer 305 (not shown). In another embodiment, the pointer increment signals generated by the write pointer logic 325 may be brute-force synchronized using multiple flip-flops clocked using the second clock signal instead synchronizing the (write) pointer increment signals using the RX pausible synchronizer 310 shown in FIG. 3A. Similarly, the corresponding (write) pointer acknowledge signal may be brute-force synchronized using multiple flip-flops clocked using the first clock signal instead of synchronizing the (write) pointer acknowledge signal using the TX pausible synchronizer 305 shown in FIG. 3A.

Figure 3C:
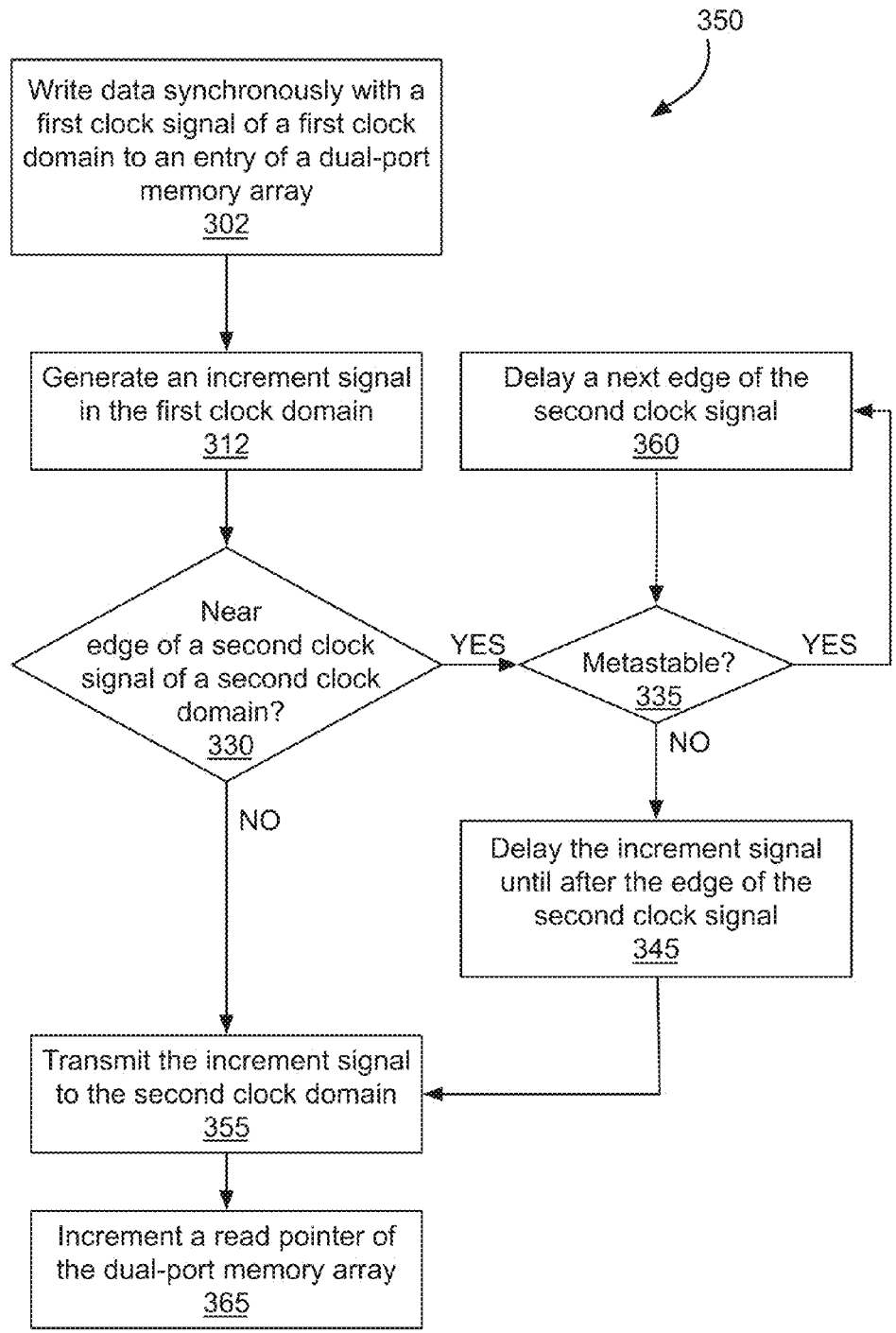
FIG. 3C illustrates a method for updating the read pointer and write pointer of the pausible bisynchronous FIFO, in accordance with one embodiment.

FIG. 3C illustrates a method 350 for updating the read pointer and write pointer of the pausible bisynchronous FIFO, in accordance with one embodiment. Although method 350 is described in the context of the pausible bisynchronous FIFO 300, the method 350 may also be performed by custom circuitry or by a combination of one or more of custom circuitry, a software driver, and a program. Furthermore, persons of ordinary skill in the art will understand that any system that performs method 350 is within the scope and spirit of embodiments of the present invention.

At step 302, data is written synchronously with a first clock signal of a first clock domain to an entry of a dual-port memory. In one embodiment, the first clock domain is a TX clock domain. Data is read from the dual-port memory synchronously with a second clock signal of a second clock domain. In one embodiment, both the first and second clock signals are pausible. In another embodiment, either the first clock signal or the second clock signals is pausible and the other clock signal is not pausible. The first clock signal and the second clock signal may operate at the same frequency or at different frequencies.

At step 312, an increment signal is generated in the first clock domain. At step 330, the pausible clock synchronizer 210 determines if the increment signal transitions near an edge of a second clock signal, and, if so, then at step 335, the pausible clock synchronizer 210 determines if the increment signal synchronized to the second clock domain is metastable. In one embodiment, the second clock domain is a RX clock domain. If, the increment signal synchronized to the second clock domain is not metastable, then, at step 345, the increment signal is transmitted to the second clock domain as the synchronized increment signal. Otherwise, if the increment signal synchronized to the second clock domain is metastable, then, at step 360, a next edge of the second clock signal is delayed before returning to step 335.

If, at step 330, the pausible clock synchronizer 210 determines that the increment signal does not transition near an edge of a second clock signal, then, at step 355, the increment signal is transmitted from the first clock domain to the second clock domain as the synchronized increment signal. At step 365, a read pointer of the dual-port memory array is incremented in response to receiving the increment signal. In one embodiment, an acknowledge signal is transmitted from the second clock domain to the first clock domain to confirm that the increment signal was received. In one embodiment, a second increment signal is generated in the second clock domain when data is read synchronously with the second clock signal of the second domain. An acknowledge signal may be transmitted from the first clock domain to the second clock domain to confirm that the second increment signal was received.

In real systems, the clock distribution network within the synchronous island will have some insertion delay $t_{ins}$ between the generation of the clock edges and propagation of the clock edges through the clock network to the register endpoints. The insertion delay misaligns the mutex transparent phase, which may lead to circuit failure, as described in conjunction with FIG. 5. Handling large insertion delays is a fundamental challenge of pausible clocking schemes. One known technique to allow larger insertion delay places all flip-flops adjacent to the interface on a separate clock with a much smaller clock tree. However, this approach may pose challenges with standard ASIC design tool flows.

Figure 3D:
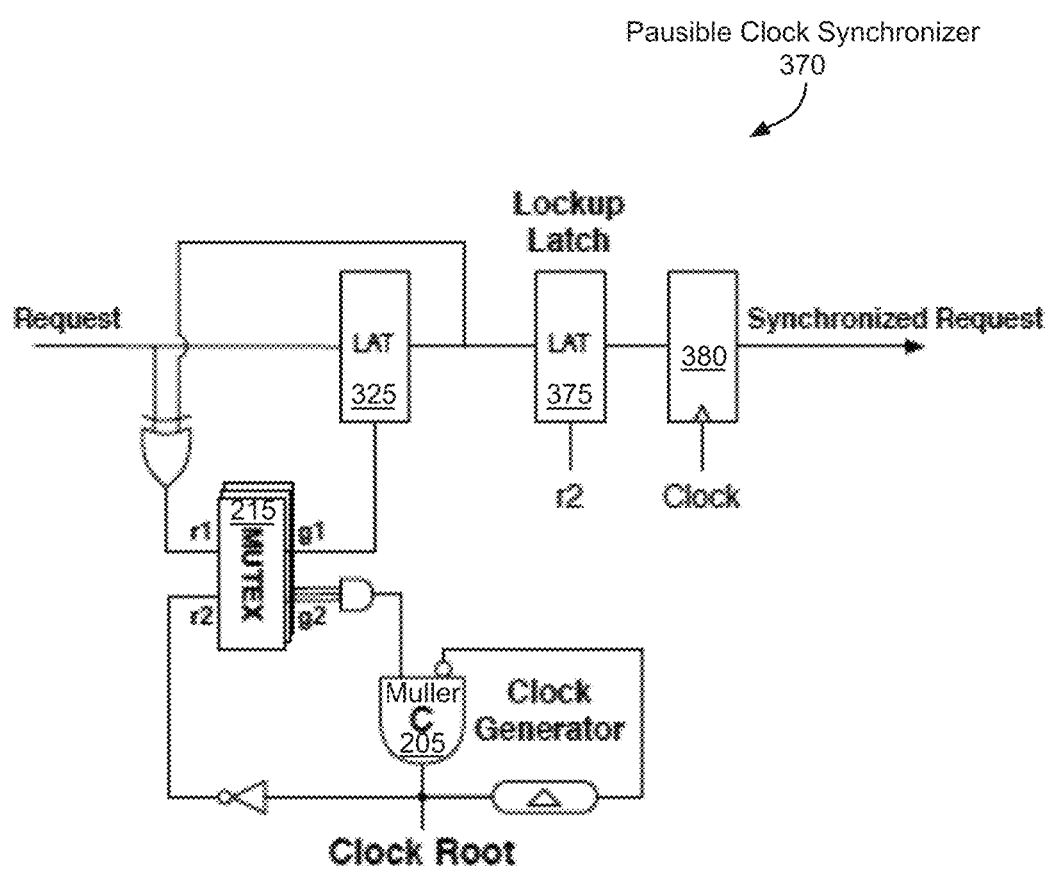
FIG. 3D illustrates another pausible clock synchronizer, in accordance with another embodiment.

FIG. 3D illustrates another pausible clock synchronizer 370, in accordance with another embodiment. The pausible clock synchronizer 370 includes an added lockup latch 375 between a latch 325 and a flip-flop 380 to guard against races caused by large insertion delays. The lockup latch 375 guards the clocked flip-flop 280 until after the clock can propagate from the root through the clock tree.

Lockup latch 375 is a transparent high latch enabled by the R2 input, so the lockup latch 375 is transparent only when the mutex 215 is not transparent. The lockup latch 375 allows requests to propagate through the transparent mutex 215 before the clock signal arrives at the leaf nodes, but then delays the request at the transparent mutex 215 until after the clock edge has safety arrived at the flip-flop clock input. The lockup latch 375 does not increase the latency of the interface because signals that would not race the clock would still have to wait for the next clock edge to be synchronized. Adding the lockup latch 375 marginally increases the area and energy of the circuit, but allows an additional T/2 of insertion delay, where T is the nominal clock period of the synchronous logic in a clock domain.

Pausible clocking integrates the logic for asynchronous boundary crossings into the clock generation mechanism for the entire synchronous island. The integration imposes constraints on the operating conditions of each of these systems. Previous work in pausible clocks does not fully address these constraints. As described further herein, a thorough accounting of the capabilities and limitations of pausible clock timing is explained, which is critical to designing a realistic system. Expressions for the average latency of the pausible interface are derived, as well as the constraints imposed upon the clock period, insertion delay, and wire delay across the synchronous island. In one embodiment, the effects of variation are neglected and circuit delays are treated as fixed quantities when deriving the timing constraints. Stochastic or worst-case corner analysis may be used to ensure timing robustness, and post-silicon tuning could alleviate the effects of process variation in one embodiment.

Figure 4A:
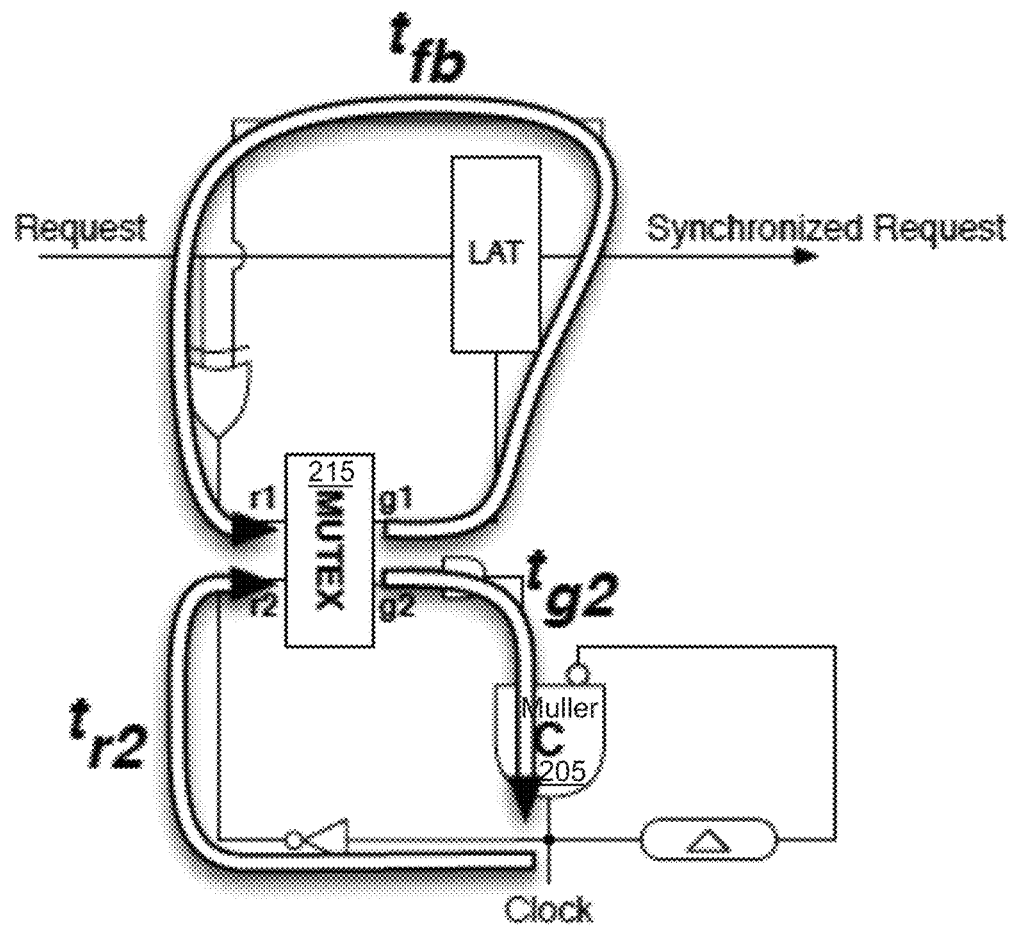
FIG. 4A illustrates timing paths of the pausible clock synchronizer shown in FIG. 2B, in accordance with one embodiment.

FIG. 4A illustrates timing paths of the pausible clock synchronizer 210 shown in FIG. 2B, in accordance with one embodiment. The important delays through the pausible clock network are shown in FIG. 4A. Table I describes each of the timing variables used in the following analysis.

TABLE I

TIMING VARIABLES

| Variable | Description |
| --- | --- |
| T | The nominal clock period of the synchronous block. |
| $T_L$ | The average latency of a data word through the interface. |
| $t_{ins}$ | The insertion delay of the clock for the synchronous block. |
| $t_{r2}$ | The delay from the output of the C-element to the mutex r2 input. |
| $t_{fb}$ | The delay from the mutex r2 input through the mutex and around the feedback path to the mutex r1 input. |
| $t_{g2}$ | The delay from the mutex r1 input through the mutex to the output of the C-element. |
| $t_{CL}$ | The minimum time available to perform combinational work on the synchronized request signal before the next clock edge. |
| $t_m$ | Time allotted to resolve mutex metastability, used to reduce the frequency of clock pauses. |
| $t_w$ | The wire delay from the boundary of the synchronous island to the local clock generator. |

$t_{r2}$ is the delay from the output of the C-element to the R2 input of the mutex 215. $t_{fb}$ is the delay from the r2 input through the mutex 215 and around the feedback loop to the R1 input. $t_{g2}$ is the delay from the mutex 215 R1 input to the output of the Muller C-element 205, including delay through the AND tree when multiple mutexes 215 contribute timing information. The sum of the three delays cannot exceed the delay through the clock generator, or else the clock will frequently pause, increasing the clock period T beyond the target for the synchronous island, as shown in FIG. 4B.

Figure 4B:
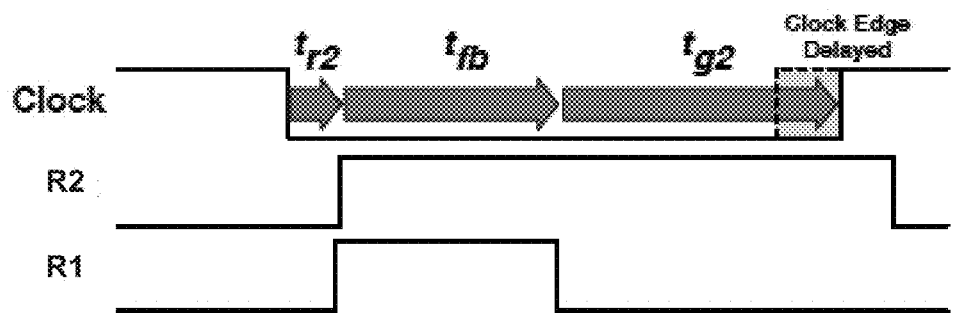
FIG. 4B illustrates a clock period timing constraint of the pausible clock synchronizer shown in FIG. 2B, in accordance with one embodiment.

FIG. 4B illustrates a clock period timing constraint of the pausible clock synchronizer 210 shown in FIG. 2B, in accordance with one embodiment. In the worst case, a request arrives just before R2 goes high. When the sum of the delays through the pausible circuit is longer than half the clock period T, the next clock edge is delayed, as shown in FIG. 4B.

Figure 4C:
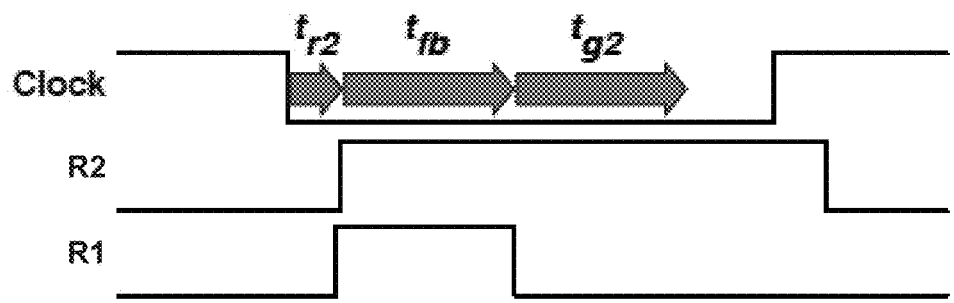
FIG. 4C illustrates another clock period timing constraint of the pausible clock synchronizer shown in FIG. 2B, in accordance with one embodiment.

FIG. 4C illustrates another clock period timing constraint of the pausible clock synchronizer 210 shown in FIG. 2B, in accordance with one embodiment. When the sum of the delays through the pausible circuit is shorter than half the clock period T, the clock edge occurs on time.

Since the clock generator delay is set to T/2 for a desired clock period T, the three delays collectively enforce a minimum clock period for the synchronous block:

$$T/2 \geq t_{r2} + t_{fb} + t_{g2} \quad (1)$$

If this clock period constraint is exceeded, then the timing slack in the system translates into a margin $t_m$ that guards against the effect of clock pauses:

$$t_m = T/2 - (t_{r2} + t_{fb} + t_{g2}) \quad (2)$$

Metastability of the mutex 215 can be seen as a temporary increase in $t_{fb}$ caused by simultaneous toggling of the inputs R1 and R2. If equation (1) is just satisfied (that is, if $T/2 = t_{r2} + t_{fb} + t_{g2}$), then $t_m = 0$, and any mutex metastability that delays the mutex 215 output g2 will cause the clock to pause. If $t_m > 0$, then some metastability can be tolerated before a clock pause occurs. In practice, in one embodiment, mutex metastability is an infrequent event, and long clock pauses are rare. Therefore, trading off increased $t_m$ in favor of other more critical timing parameters may be a good strategy.

Figure 4D:
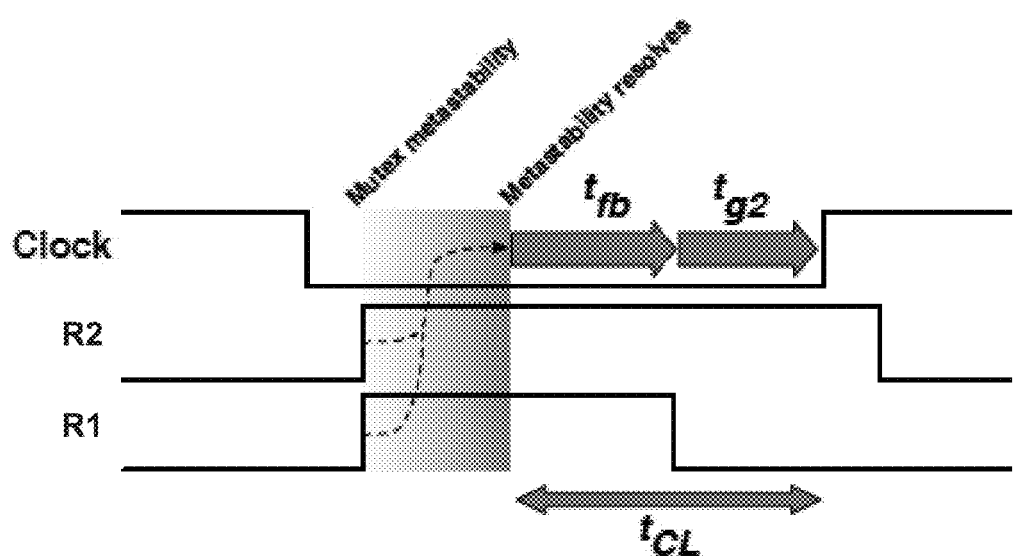
FIG. 4D illustrates a setup timing constraint of the pausible clock synchronizer shown in FIG. 2B, in accordance with one embodiment.

In one embodiment, the low latency of the pausible bisynchronous FIFO 300 depends on the ability of the RX pointer logic to immediately respond to a write pointer update by asserting data valid before the next RX clock edge arrives. FIG. 4D illustrates a setup timing constraint of the pausible clock synchronizer 210 shown in FIG. 2B, in accordance with one embodiment. In one embodiment, the setup timing constraint is the worst-case setup time.

The available time to complete combinational work within the same cycle as a received request is $t_{CL}$. In the worst case for the timing path, metastability in the mutex 215 causes a clock pause before resolving in favor of R1. When g1 toggles, a clock edge will be generated as soon as this signal propagates around the feedback loop to the clock generator. Thus, the time $t_{CL}$ available for logic before this clock edge is only $$t_{CL} = t_{fb} + t_{g2}. \quad (3)$$

The $t_{CL}$ parameter is constrained by the complexity of the pointer logic; if a long enough time is not apportioned for $t_{CL}$, then an extra register should be inserted before the logic to "pipeline" the computation, increasing the latency of the interface by one cycle. If $t_m > 0$, then increasing $t_{fb}$ by adding delay to the feedback path trades off excess $t_m$ to increase the time available for same-cycle combinational work.

In order to derive the average latency of the interface, the phase at which the request signal arrives must be considered. If a request signal (e.g., R2) arrives while the mutex 215 is transparent, the request can be serviced within the same cycle. Assuming that the fully asynchronous request signal is equally likely to arrive at any phase, the average latency of such requests is $0.75T - t_{r2}$. If the request arrives while the mutex 215 is opaque, then the request cannot be serviced until the next cycle. The average latency of such requests is $1.25T - t_{r2}$. If the duty cycle of the clock is 50%, then taking the mean of these two expressions gives the average latency $t_L$ of the interface as a whole:

$$t_L = T - t_{r2} \quad (4)$$

Increasing $t_{r2}$ decreases the average latency of the interface because it shifts the transparent phase of the mutex 215 closer to the next clock edge. If $t_m > 0$, then increasing $t_{r2}$ by adding delay to the R2 input of the mutex 215 trades off excess $t_m$ to decrease the average latency through the interface. Since $t_m$ can also be traded for additional $t_{CL}$, this means that there is a trade-off between reducing latency and increasing the time available for combinational work in the read pointer logic.

Figure 5:
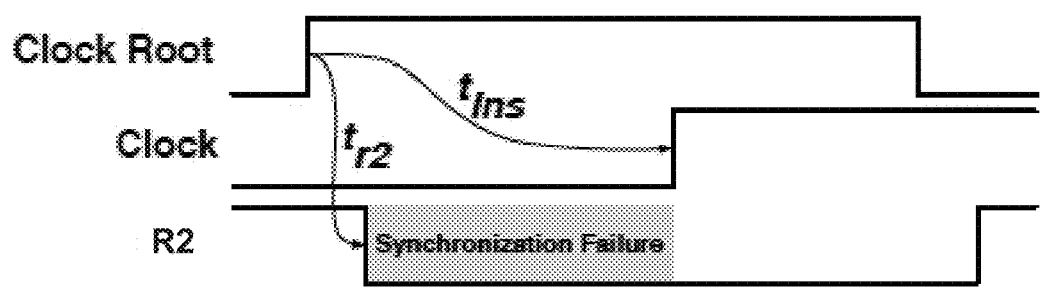
FIG. 5 illustrates an effect of insertion delay on the pausible clock synchronizer shown in FIG. 2B, in accordance with one embodiment.

In real systems, the clock distribution network within the synchronous island will have some insertion delay $t_{ins}$ between the generation of the clock edges and their propagation through the clock network to the register endpoints. Insertion delay mis-aligns the transparent phase of the mutex 215, which could lead to circuit failure as shown in FIG. 5. FIG. 5 illustrates an effect of insertion delay on the pausible clock synchronizer shown in FIG. 2B, in accordance with one embodiment. Small insertion delays can be compensated by intentionally increasing $t_{r2}$ to match $t_{ins}$, realigning the phases and protecting against metastability. However, the clock period constraint from (1) limits the increase in $t_{r2}$. Setting $t_{r2} = t_{ins}$ yields the constraint on the insertion delay permitted for a given clock period:

$$t_{ins} \leq T/2 - t_{fb} - t_{g2} \quad (5)$$

As previously explained, a lockup latch may be added to the pausible synchronizer circuit shown, as shown in FIG. 4B to guard against races caused by large insertion delays. Adding latches marginally increases the area and energy of the circuit, but allows an additional T/2 of insertion delay:

$$t_{ins} \leq T - t_{fb} - t_{g2} \quad (6)$$

Figure 6A:
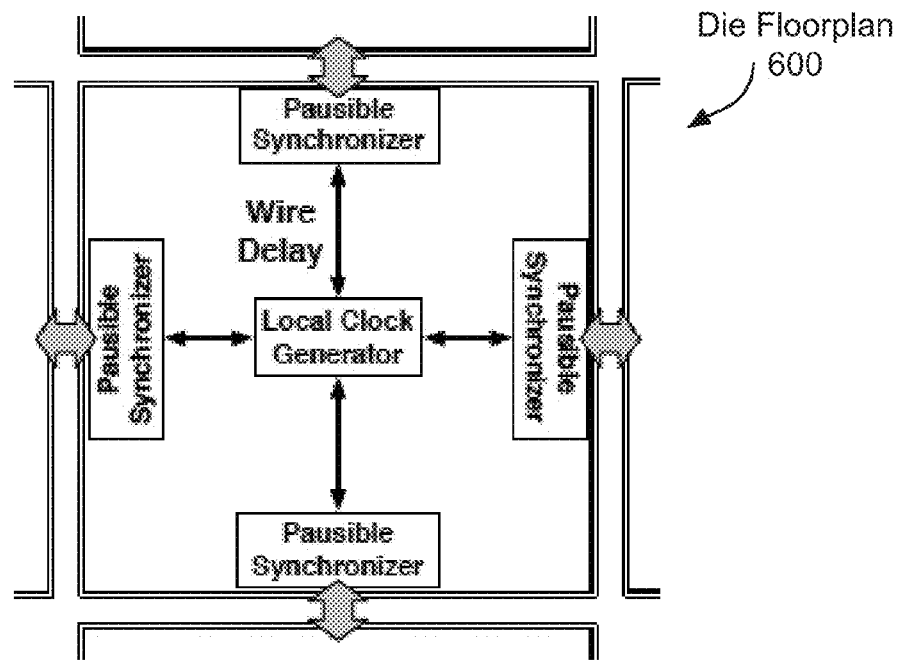
FIG. 6A illustrates a block diagram showing physical placement of a pausible clocking system, in accordance with one embodiment.

However, $t_{CL}$ is decreased by the delay through the transparent latch, as the asynchronous request must propagate through the synchronous island, with the local clock generator centrally located as in FIG. 6A. This adds a wire delay $t_w$ to $t_{r2}$ and $t_{g2}$, increasing the minimum achievable cycle time (from (1)) and decreasing the maximum allowable insertion delay (from (5)).

FIG. 6A illustrates a die floorplan 600 showing physical placement of a pausible clocking system, in accordance with one embodiment. The physical location of the logic within the pausible clock synchronizers 210 and/or 370 corresponding to each synchronous island determines wire delays imposed on the pausible clocking system by the wire delay incurred to traverse each synchronous island. In die floorplan 600, the synchronizer circuitry (i.e., mutex 215, XOR gate, latch(es), and flip-flop) is placed near the boundary of the synchronous island and the clock generator portion (i.e., the Muller C-element 205 and critical path delay line) of the pausible clock synchronizers 210 and/or 370 is placed near the center of the die.

Figure 6B:
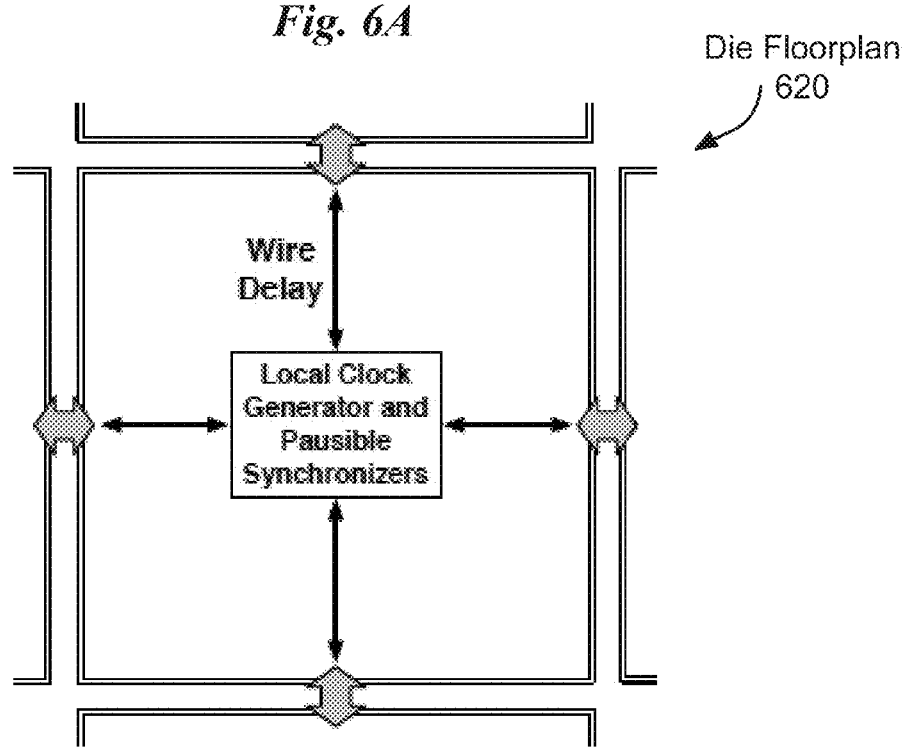
FIG. 6B illustrates another block diagram showing physical placement of a pausible clocking system, in accordance with one embodiment.

FIG. 6B illustrates another die floorplan 620 showing physical placement of a pausible clocking system, in accordance with one embodiment. In die floorplan 620, the synchronizer circuitry (i.e., mutex 215, XOR gate, latch(es), and flip-flop) is placed near the center of the die and the clock generator portion (i.e., the Muller C-element 205 and critical path delay line) of the pausible clock synchronizers 210 and/or 370 is also placed near the center of the die. Locating the synchronizer circuitry near the clock generator portion adds $t_w$ to the latency of the system, but does not impact the cycle time or insertion delay constraints. $t_w$ may be reduced for the die floorplan 600 and/or 620 by using higher metal layers and dedicated routing channels to transmit these critical signals. Even with these considerations, $t_w$ will likely be a substantial fraction of the clock period for most systems, and will therefore have a noticeable impact on system performance.

The pausible bisynchronous FIFO 300 provides a low-latency asynchronous interface that works well with standard design tools. The pausible bisynchronous FIFO 300 combines pausible clocking techniques with standard two-ported synchronous FIFOs that integrate easily into standard toolflows. In one embodiment, the pausible bisynchronous FIFO 300 achieves an average of 1.34 cycles of latency, while incurring minimal energy and area overhead over a synchronous interface. The pausible bisynchronous FIFO 300 flow-control scheme for the read and write pointers uses two-phase increment and acknowledge signals to transmit data across an asynchronous interface.

The timing constraints imposed by pausible clocking systems include consideration of the delay required for signals to traverse the distance between the interface and the clock generator circuit. Careful analysis of the timing constraints imposed by the system allows full integration with standard ASIC design tool flows. Therefore, the pausible bisynchronous FIFO 300 is a key enabling technology for fine-grained GALS systems, which can mitigate many of the challenges of modern SoC design.

Figure 7:
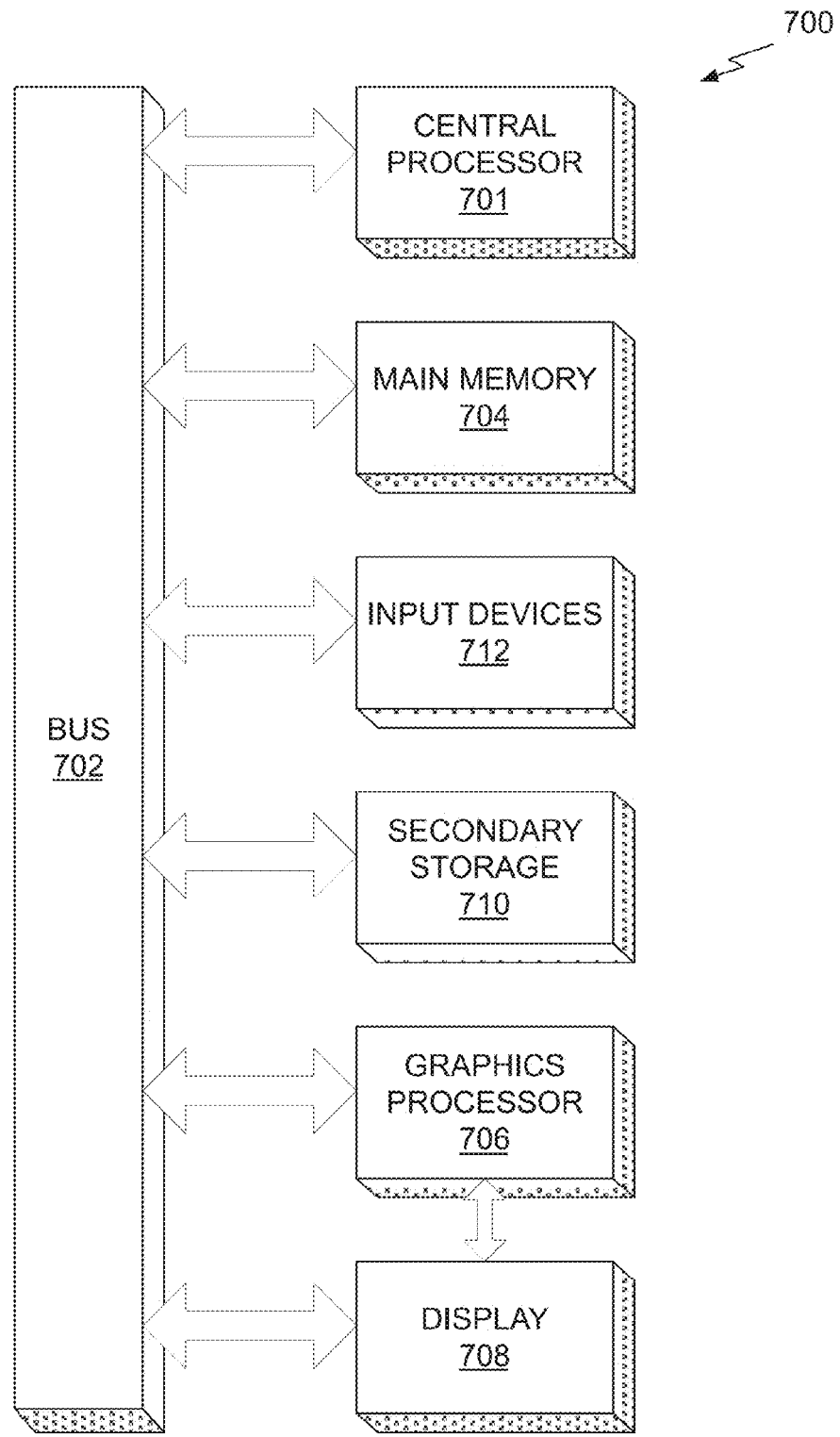
FIG. 7 illustrates an exemplary system in which the various architecture and/or functionality of the various previous embodiments may be implemented.

FIG. 7 illustrates an exemplary system 700 in which the various architecture and/or functionality of the various previous embodiments may be implemented. As shown, a system 700 is provided including at least one central processor 701 that is connected to a communication bus 702. The communication bus 702 may be implemented using any suitable protocol, such as PCI (Peripheral Component Interconnect), PCI-Express, AGP (Accelerated Graphics Port), HyperTransport, or any other bus or point-to-point communication protocol(s). The system 700 also includes a main memory 704. Control logic (software) and data are stored in the main memory 704 which may take the form of random access memory (RAM).

The system 700 also includes input devices 712, a graphics processor 706, and a display 708, i.e. a conventional CRT (cathode ray tube), LCD (liquid crystal display), LED (light emitting diode), plasma display or the like. In one embodiment, a distortion function is defined for the display 708. User input may be received from the input devices 712, e.g., keyboard, mouse, touchpad, microphone, and the like. In one embodiment, the graphics processor 706 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 700 may also include a secondary storage 710. The secondary storage 710 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner. Computer programs, or computer control logic algorithms, may be stored in the main memory 704 and/or the secondary storage 710. Such computer programs, when executed, enable the system 700 to perform various functions. The main memory 704, the storage 710, and/or any other storage are possible examples of computer-readable media.

In one embodiment, the architecture and/or functionality of the various previous figures may be implemented in the context of the central processor 701, the graphics processor 706, an integrated circuit (not shown) that is capable of at least a portion of the capabilities of both the central processor 701 and the graphics processor 706, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 700 may take the form of a desktop computer, laptop computer, server, workstation, game consoles, embedded system, and/or any other type of logic. Still yet, the system 700 may take the form of various other devices including, but not limited to a personal digital assistant (PDA) device, a mobile phone device, a television, etc.

Further, while not shown, the system 700 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
   writing data synchronously with a first clock signal of a first clock domain to an entry of a dual-port memory array;
   generating an increment signal in the first clock domain;
   determining that the increment signal transitions near an edge of a second clock signal of a second clock domain, wherein the second clock signal is a pausible clock signal;
   delaying a next edge of the second clock signal until metastability of the increment signal is resolved; and
   transmitting the increment signal to the second clock domain.

2. The method of claim 1, further comprising:
   receiving the increment signal in the second clock domain; and
   incrementing an approximate write pointer value.

3. The method of claim 2, further comprising determining whether the dual-port memory array is full by comparing the approximate write pointer value with a read pointer value.

4. The method of claim 2, further comprising, in response to receiving the increment signal in the second domain:
   generating an acknowledge signal in the second clock domain; and
   transmitting the acknowledge signal to the first clock domain.

5. The method of claim 1, further comprising incrementing a write pointer in the first clock domain.

6. The method of claim 1, wherein the increment signal is transmitted to the second clock domain through a latch coupled to a flip-flop.

7. The method of claim 1, wherein the first clock signal is a pausible clock signal.

8. The method of claim 1, wherein the first clock signal is not a pausible clock signal.

9. A method, comprising:
   writing data synchronously with a first clock signal of a first clock domain to an entry of a dual-port memory array;
   generating an increment signal in the first clock domain;
   determining that the increment signal transitions near an edge of a pausible second clock signal of a second clock domain;
   delaying a next edge of the pausible second clock signal;
   transmitting the increment signal to the second clock domain;
   receiving the increment signal in the second clock domain;
   generating an acknowledge signal in the second clock domain, in response to receiving the increment signal in the second domain;
   transmitting the acknowledge signal to the first clock domain, in response to receiving the increment signal in the second domain;
   incrementing an approximate write pointer value;
   before the acknowledge signal is received in the first clock domain, writing second data synchronously with the first clock signal of the first clock domain to a second entry of the dual-port memory array;
   generating a second increment signal in the first clock domain; and
   transmitting the second increment signal to the second clock domain.

10. A method, comprising:
    writing data synchronously with a first clock signal of a first clock domain to an entry of a dual-port memory array;
    generating an increment signal in the first clock domain;
    determining that the increment signal transitions near an edge of a pausible second clock signal of a second clock domain;
    delaying a next edge of the pausible second clock signal;
    transmitting the increment signal to the second clock domain;
    in response to receiving the increment signal in the second domain, generating an acknowledge signal in the second clock domain;
    determining that the acknowledge signal transitions near an edge of the first clock signal;
    delaying a next edge of the first clock signal of the first clock domain; and
    transmitting the acknowledge signal to the first clock domain.

11. A method, comprising:
    writing data synchronously with a first clock signal of a first clock domain to an entry of a dual-port memory array;
    generating an increment signal in the first clock domain;
    determining that the increment signal transitions near an edge of a pausible second clock signal of a second clock domain;

delaying a next edge of the pausible second clock signal;
transmitting the increment signal to the second clock domain;
in response to receiving the increment signal in the second domain, generating an acknowledge signal in the second clock domain;
determining that the acknowledge signal transitions while the first clock signal is high; and
transmitting the acknowledge signal to the first clock domain.

12. A method, comprising:
writing data synchronously with a first clock signal of a first clock domain to an entry of a dual-port memory array;
generating an increment signal in the first clock domain;
determining that the increment signal transitions near an edge of a pausible second clock signal of a second clock domain;
delaying a next edge of the pausible second clock signal;
transmitting the increment signal to the second clock domain;
in response to receiving the increment signal in the second domain, generating an acknowledge signal in the second clock domain;
determining that the acknowledge signal transitions while the first clock signal is low; and
transmitting the acknowledge signal to the first clock domain after a next edge of the first clock signal.

13. A method, comprising:
writing data synchronously with a first clock signal of a first clock domain to an entry of a dual-port memory array;
generating an increment signal in the first clock domain;
determining that the increment signal transitions near an edge of a pausible second clock signal of a second clock domain;
delaying a next edge of the pausible second clock signal;
transmitting the increment signal to the second clock domain;
writing second data synchronously with the first clock signal of the first clock domain to a second entry of the dual-port memory array;
generating a second increment signal in the first clock domain;
determining that the second increment signal transitions while the pausible second clock signal is high; and
transmitting the second increment signal to the second clock domain.

14. A method, comprising:
writing data synchronously with a first clock signal of a first clock domain to an entry of a dual-port memory array;
generating an increment signal in the first clock domain;
determining that the increment signal transitions near an edge of a pausible second clock signal of a second clock domain;
delaying a next edge of the pausible second clock signal;
transmitting the increment signal to the second clock domain;
writing second data synchronously with the first clock signal of the first clock domain to a second entry of the dual-port memory array;
generating a second increment signal in the first clock domain;
determining that the second increment signal transitions while the pausible second clock signal is low; and
transmitting the second increment signal to the second clock domain after a next edge of the pausible second clock signal.

15. A method, comprising:
writing data synchronously with a first clock signal of a first clock domain to an entry of a dual-port memory array;
generating an increment signal in the first clock domain;
determining that the increment signal transitions near an edge of a pausible second clock signal of a second clock domain;
delaying a next edge of the pausible second clock signal;
transmitting the increment signal to the second clock domain;
reading the data synchronously with the pausible second clock signal of the second clock domain from the entry of the dual-port memory array;
generating a second increment signal in the second clock domain; and
transmitting the second increment signal to the first clock domain.

16. A method, comprising:
writing data synchronously with a first clock signal of a first clock domain to an entry of a dual-port memory array;
generating an increment signal in the first clock domain;
determining that the increment signal transitions near an edge of a pausible second clock signal of a second clock domain;
delaying a next edge of the pausible second clock signal; and
transmitting the increment signal to the second clock domain through a latch coupled to a flip-flop, wherein a second latch is coupled between the latch and the flip-flop.

17. A method, comprising:
writing data synchronously with a first clock signal of a first clock domain to an entry of a dual-port memory array;
generating an increment signal in the first clock domain;
determining, by a mutual exclusion element circuit, that the increment signal transitions near an edge of a pausible second clock signal of a second clock domain;
delaying a next edge of the pausible second clock signal; and
transmitting the increment signal to the second clock domain.

18. A system, comprising:
a pausible bisynchronous first-in first-out (FIFO) buffer comprising:
a dual-port FIFO comprising a dual-port memory array;
write pointer logic that is coupled to the dual-port configured to:
write data synchronously with a first clock signal of a first clock domain to an entry of a dual-port memory array; and
generate an increment signal in the first clock domain;
a pausible clock synchronizer circuit that is coupled to the write pointer logic and configured to:
delay a next edge of a second clock signal of a second clock domain when the increment signal transitions near an edge of the second clock signal of the second clock domain, wherein the second clock signal is a pausible clock signal; and
transmit the increment signal to the second clock domain.

19. The system of claim 18, wherein the pausible clock synchronizer circuit is further configured to delay a next edge of the second clock signal is until metastability of the increment signal is resolved.

* * * * *

UNITED STATES PATENT AND TRADEMARK OFFICE
CERTIFICATE OF CORRECTION

PATENT NO. : 9,672,008 B2  
APPLICATION NO. : 14/948175  
DATED : June 6, 2017  
INVENTOR(S) : Benjamin Andrew Keller et al.

Page 1 of 1

It is certified that error appears in the above-identified patent and that said Letters Patent is hereby corrected as shown below:

On the Title Page

In the abstract, item (57), Line 7, please replace "second dock" with --second clock--.

In the Specification

Column 4, Line 9 please replace "fir inclusion" with --for inclusion--;
Column 4, Line 19 please replace "adaptive dock" with --adaptive clock--;
Column 8, Line 8 please replace "dock cycle," with --clock cycle,--;
Column 8, Line 13 please replace "empty. Time" with --empty. The--;
Column 9, Line 4 please replace "B)." with --(label B).--;
Column 11, Line 7 please replace "safety arrived" with --safely arrived--.

Signed and Sealed this
Eighteenth Day of February, 2020

Andrei Iancu
*Director of the United States Patent and Trademark Office*